(12) United States Patent
Taguchi et al.

(10) Patent No.: US 8,390,246 B2
(45) Date of Patent: Mar. 5, 2013

(54) BATTERY CHARGE STATE TRANSMISSION DEVICE AND EXTERNAL CHARGING SYSTEM

(75) Inventors: Shinya Taguchi, Kariya (JP); Hiroshige Asada, Nagoya (JP); Takashi Kanamori, Nagoya (JP)

(73) Assignee: DENSO CORPORATION, Kariya (JP)

( * ) Notice: Subject to any disclaimer, the term of this patent is extended or adjusted under 35 U.S.C. 154(b) by 298 days.

(21) Appl. No.: 12/923,101

(22) Filed: Sep. 2, 2010

(65) Prior Publication Data

US 2011/0057612 A1 Mar. 10, 2011

(30) Foreign Application Priority Data

Sep. 4, 2009 (JP) ................................. 2009-204968

(51) Int. Cl.
*H01M 10/46* (2006.01)
(52) U.S. Cl. ...................................................... 320/104
(58) Field of Classification Search .................. 320/104, 320/107, 115, 116; 414/269, 270, 273
See application file for complete search history.

(56) References Cited

U.S. PATENT DOCUMENTS

| 8,138,720 B2 * | 3/2012 | Snyder et al. ................. 320/127 |
| 2007/0152813 A1 * | 7/2007 | Mathur et al. .................. 702/45 |
| 2009/0322154 A1 | 12/2009 | Ichikawa et al. |
| 2011/0258112 A1 * | 10/2011 | Eder et al. ..................... 320/109 |

FOREIGN PATENT DOCUMENTS

| JP | A-11-215176 | 8/1999 |
| JP | A-2000-285356 | 10/2000 |
| JP | A-2002-123888 | 4/2002 |

OTHER PUBLICATIONS

Office Action dated Oct. 23, 2012 in corresponding CN Application No. 201010276535.3 (and English translation).

* cited by examiner

*Primary Examiner* — Edward Tso
(74) *Attorney, Agent, or Firm* — Posz Law Group, PLC

(57) ABSTRACT

A communication part of a battery charge state transmission device of a charging device acquires charge state information of each external charge vehicle. A station communication part transmits the charge state information to an information management station device. The charge state information is grouped for transmission so that the number of transmissions, the amount of communication traffic and the cost of communication with the management station device, and the operation load of the management station device are reduced.

12 Claims, 6 Drawing Sheets

BATTERY CHARGE STATE TRANSMISSION DEVICE AND EXTERNAL CHARGING SYSTEM

CROSS REFERENCE TO RELATED APPLICATION

The present application is based on and incorporates herein by reference Japanese patent application No 2009-204968 filed on Sep. 4, 2009.

FIELD OF THE INVENTION

The present invention relates to a battery charge state transmission device, which is used in an external charging system including a plurality of external charging devices for charging batteries of motor-driven vehicles such as electric or hybrid vehicles and transmits charge state information about the vehicles to a management station device. The present invention also relates to the external charging system including the battery charge state transmission device.

BACKGROUND OF THE INVENTION

A conventional electric vehicle (EV) uses only an electric motor as a travel drive power source. This electric vehicle is a motor-driven vehicle, in which a travel-use battery for supplying electric power to the motor is charged with electricity supplied from an electric power supply source external to the electric vehicle. A conventional hybrid vehicle (HV) uses both an electric motor and an internal combustion engine as a travel drive power source. This hybrid vehicle is also a motor and engine-driven vehicle (plug-in hybrid vehicle PHV), in which a travel-use battery is charged with electricity supplied from an electric power supply source external to the hybrid vehicle.

In charging the battery of vehicle, for example, the battery is charged by electrically connecting a motor-driven vehicle to a charging device such as an exclusive charging station. It is proposed recently to monitor the charge state of the battery of the vehicle at a location away from the charging device and the vehicle.

The following patent document proposes one technology for monitoring a charge state of a battery mounted on an electric vehicle at a location remote from the electric vehicle. According to this technology, the electric vehicle is provided with an in-vehicle communication device, which transmits charge information of the battery through a mobile device packet communication network to a charge management station located at a remote place. The charge information of the battery of the electric vehicle is thus acquired at the remote location away from the electric vehicle. The patent document 1 further proposes another technology for managing charge states of a plurality of electric vehicles. According to this technology, the in-vehicle communication device is provided in each of the plurality of electric vehicles and communicates with the charge management station.

Patent document: JP 2002-123888A

According to the technology proposed by the patent document, the charge management station communicates with each of the in-vehicle communication devices of the electric vehicles. It is therefore necessary to perform the communication through the mobile device packet communication network as many times as the number of the electric vehicles, the charge states of the batteries of which should be monitored. This results in an increase in the amount of communication traffic.

Further, according to the technology proposed by the patent document, the communication between the charge management station and each in-vehicle communication device of the electric vehicles is performed through the mobile device packet communication network, which is toll-charged. This also results in an increase in the amount of communication costs in correspondence to the increased in the amount of communication traffic.

In addition, according to the technology proposed by the patent document, the communication is performed between one charge management station and the plurality of in-vehicle communication devices of the electric vehicles. This results in an increase in the load of communication processing at the charge management station.

SUMMARY OF THE INVENTION

It is therefore an object of the present invention to provide a battery charge state transmission device and an external charging system, which reduce the amount of communication traffic with a communication device of a management station, communication cost and processing load at the communication device of the management station.

According to one aspect of the present invention, an external charging system and a battery charge state transmission device for the external charging system are provided. The external charging system is provided for a plurality of external charge vehicles, each of which includes an electric motor as a travel drive power source and a battery for supplying electric power to the electric motor.

The external charging system comprises a plurality of external charging devices, a management station device and a battery charge state transmission device. The plurality of external charging devices is provided externally to the vehicles for charging the battery from an external side of each vehicle. The management station device is provided for managing the plurality of external charging devices. The battery charge state transmission device is provided to transmit charge state information indicating a state of charge of the battery to the management station device.

The battery charge state transmission device includes a charge state information acquisition part and a station transmission part. The charge state information acquisition part is configured to acquire the charge state information from the plurality of external charging devices charging the vehicles or from the plurality of vehicles being charged by the plurality of charging devices. The station transmission part is configured to transmit a plurality of charge state information to the management station device in a lump, the plurality of charge state information being acquired by the charge state information acquisition part.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in more detail with reference to one embodiment.

Figure 1:
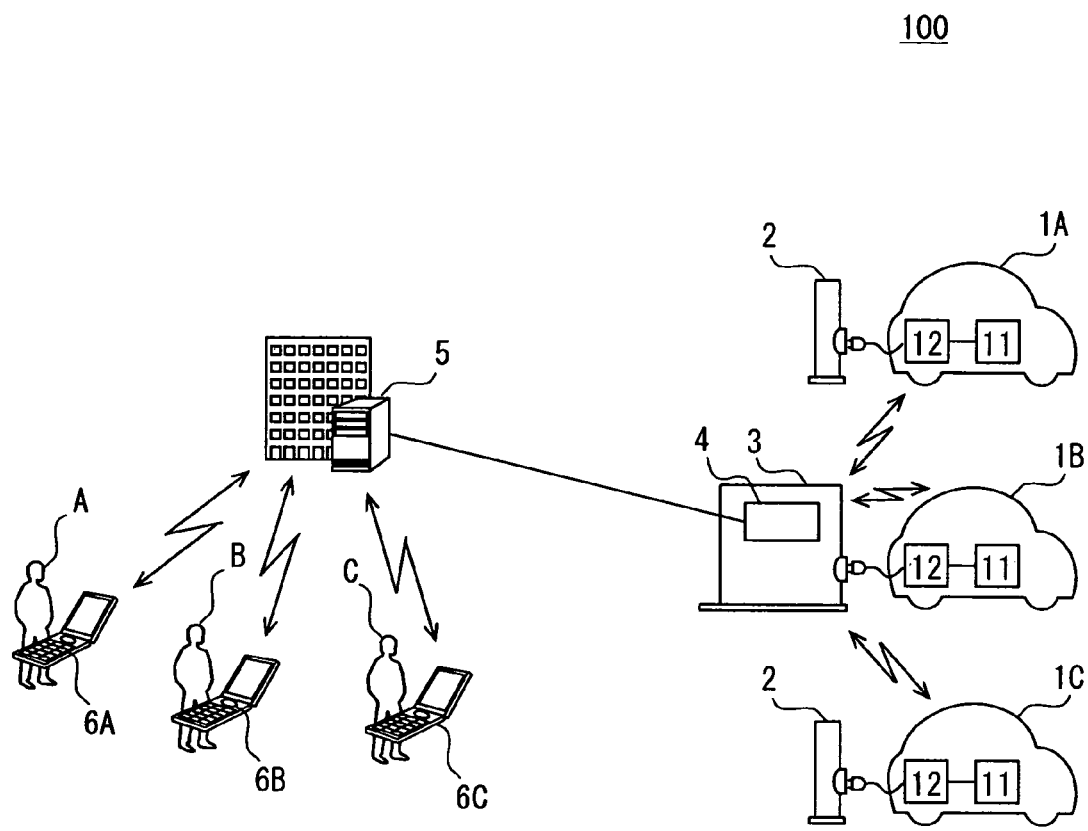
FIG. 1 is a schematic diagram showing an external charging system according to one embodiment of the present invention.

Referring to FIG. 1, an external charging system 100 is provided for a plurality of external charge vehicles 1A to 1C. Each of the vehicles 1A to 1C is referred to as a vehicle 1, unless it is necessary to distinguish them. Each vehicle 1 has a battery, which is chargeable externally. The external charging system 100 includes auxiliary charging devices 2, a main charging device 3 including a battery charge state transmission device 4, a management station device 5 and mobile devices 6A to 6C such as portable phones carried by users A to C. Each of the mobile devices 6A to 6C is referred to as a mobile device 6, unless it is necessary to distinguish them. It is assumed that the users A, B and C uses the vehicles 1A, 1B and 1C and the mobile devices 6A, 6B and 6C, respectively.

Each vehicle 1 may be an electric vehicle (EV) or a hybrid vehicle (PHV). The electric vehicle uses only an electric motor 11 as its travel drive power, source. The hybrid vehicle uses the motor 11 and/or an internal combustion engine (not shown) as its travel drive power source. The vehicle 1 includes a travel-use battery 12, which is charged with electricity from an external side.

Figure 2:
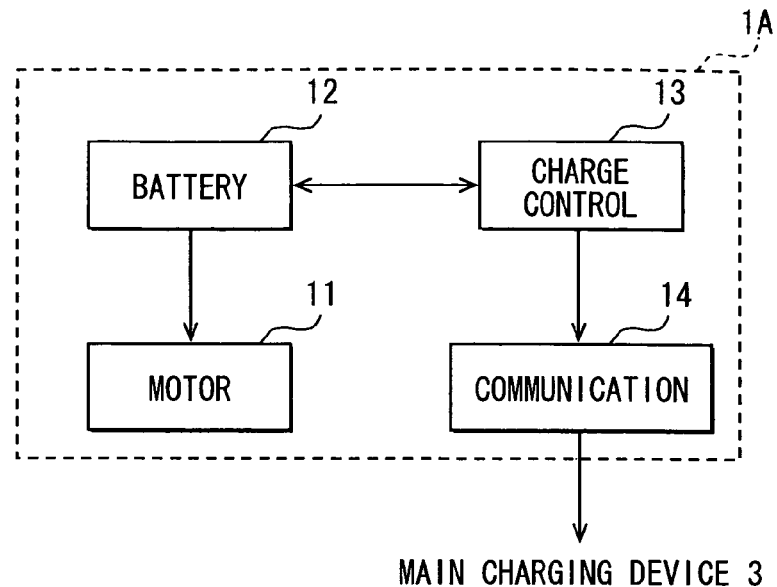
FIG. 2 is a block diagram schematically showing a vehicle having an externally-chargeable battery in the embodiment.

As shown in FIG. 2, each vehicle 1, for example 1A, is configured to have a charge control part 13 and a charging device communication part 14, which communicates with charging devices, in addition to the motor 11 and the battery 12.

The motor 11 is a machine, which converts electric energy supplied from the external side such as the battery 12 to rotary energy, and used as the travel drive power source of the vehicle 1. The battery 12 supplies electric power to the motor 11.

The charge control part 13 includes a microcomputer, which includes a CPU, a ROM, a RAM, a backup RAM, an I/O and the like, and is configured to perform various processing by executing various control programs stored in the ROM. For example, the charge control part 13 performs various conventional processing required to charge the battery 12 by charging devices (auxiliary charging devices 2 or a main charging device 3). The charge control part 13 is configured to monitor the charge/discharge amount of the battery 12 and calculate the charge state (SOC indicating state of charge) based on the monitored charge/discharge amount. The charge state SOC is a ratio of the remaining charge amount to the full charge amount of a battery.

The communication part 14 is configured to communicate with the main charging device 3. Specifically, the communication part 14 transmits the charge state information, which is information of charge state SOC calculated by the charge control part 13, to the main charging device 3, when a request is received from the main charging device 3. The communication part 14 is configured to transmit an identifier, which identifies vehicle individually, as well as the charge state information, when the charge state information is transmitted. The identifier is, for example, a vehicle identification code (ID). The communication part 14 and the main charging device 3 may be configured to communicate each other by way of short distance radio communication such as radio LAN, ZigBee (trademark), Bluetooth (trademark) or the like.

The auxiliary charging device 2 is located, for example, at an outdoor parking lot of a shopping center for supplying electric power to the batteries 12 of the vehicles 1 thereby to charge the batteries 12. In this embodiment, it is assumed that the external charging system 100 has two auxiliary charging devices 2, by which the batteries 12 of vehicles 1A and 1C are charged, respectively, as shown in FIG. 1. The external charging system 100 may include less than or more than two auxiliary charging devices 2.

Each auxiliary charging device 2 may have the same or similar configuration as in the conventional charging devices provided for vehicles. The auxiliary charging device 2 may supply electric power to the battery 12 by way of a contact method using a plug-in device or a non-contact method using electromagnetic induction.

The main charging device 3 is located, for example, at an outdoor parking lot of a shopping center for supplying electric power to the batteries 12 of the vehicles 1. In this embodiment, it is assumed as shown in FIG. 1 that the external charging system 100 has one main charging device 3, by which the battery 12 of the vehicle 1B is charged. The main charging device 3 may have the same or similar configuration as the auxiliary charging device 2 except that the main charging device 3 further has the battery charge state transmission device 4. Each of the auxiliary charging devices 2 and the main charging device 3 is an external charging device.

Figure 3:
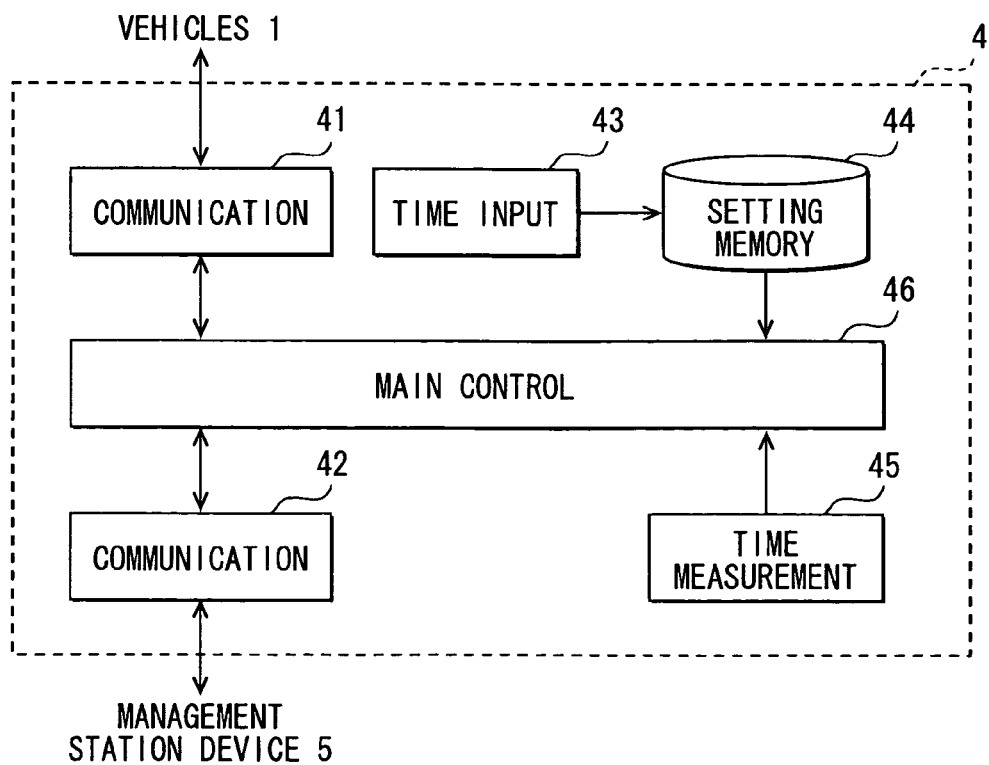
FIG. 3 is a block diagram schematically showing one example of a battery charge state transmission device in the embodiment.

The battery charge state transmission device 4 is configured as shown in FIG. 3.

Specifically, the battery charge state transmission device 4 includes a vehicle communication part 41, a station communication part 42, a transmission time input part 43, a memory part 44, a time measurement part 45 and a main control part 46.

The vehicle communication part 41 is provided for communication with the communication part 14 of each vehicle 1 and configured to receive a data set of the charge state information and the vehicle ID transmitted from the communication part 14 and transmit it to the main control part 46. The main control part 46 thus corresponds to a charge state information acquisition part.

The communication part 42 is provided for communication with the management station device 5 of an information management station through a communication network such as Internet or cellular phone network and configured to transmit a data set of the charge state information and the vehicle ID received from the communication part 14 of each vehicle 1 to the management station device 5 under control of the main control part 46. The communication part 42 thus corresponds to a station transmission part. The communication part 42 may be connected to the communication network by way of radio communication or wired communication. The communication part 42 is further configured to receive information transmitted from the management station device 5 and transmit the received information to the main control part 46.

The time input part 43 includes a mechanical switch or a touch switch integrated with a display device, for example, and is configured to enable users A to C (FIG. 1) of vehicles 1A to 1C to input respective desired time of transmission by operating the switch. The time input part 43 is configured to transmit a data set of the inputted time and the vehicle ID of the vehicle 1, for which the transmission time point is set by the time input part 43, to the memory part 44. The vehicle ID and the transmission time may be combined into the data set by, for example, requesting the input of the vehicle ID at the same time as the user inputs the desired transmission time. Alternatively, the vehicle ID and the transmission time may be combined into the data set in association with the charging device, that is, the auxiliary charging device 2 or the main charging device 3. Specifically, for example, the time input part 43 of each charging device, which charges vehicles 1, receives the input of the transmission time from the user, and acquires the vehicle ID of vehicle 1, which is to be charged by the charging device receiving the input of the transmission time. The received transmission time and the acquired vehicle ID are combined into one data set. The vehicle ID inputted by the user at the auxiliary charging device 2 may be transmitted to the main charging device 3, specifically to the time input part 43 of the battery charge state transmission device 4 by way of wired communication or radio communication. The vehicle ID may be acquired from the auxiliary charging device 2 or the main charging device 3 by way of short distance radio communication, wired communication or power line communication (PLC) using a charging cable.

The transmission time is a time point of transmission of the charge state information from the communication part 42 to the management station device 5. This time point corresponds to a time point, at which the user receives the charge state information of his/her vehicle by his/her mobile device 6. By setting the time of transmission of the charge state information from the communication part 42 to the management station device 5, the time of reception of the charge state information of his/her vehicle by his/her mobile device 6 is set.

The transmission time may be inputted as a predetermined time interval, for example, an interval of 10 minutes (every 10 minutes), 20 minutes, 40 minutes and the like, as a predetermined charge level interval of the battery 12, for example, an interval of SOC 10%, SOC 20% and the like, or as a predetermined charge level of the battery 12, for example SOC 80%, 100% (fully charged). One or more of these may be selectively inputted.

The memory part 44 is provided for storing the transmission time received from the time input part 43 with respect to each of vehicles 1. The memory part 44 may be an electrically erasable and programmable read only memory (EEPROM) or a RAM, which is electrically rewritable. The time measurement part 45 includes, for example, a timer circuit and is configured to measure elapse time.

The main control part 46 is a microcomputer, which includes a CPU, a ROM, a RAM, a backup RAM and the like, and configured to perform various processing by executing various control programs stored in the ROM. For example, the main control part 46 is configured to set the transmission time of transmission of the data set, which includes the charge state information and the vehicle ID, from the communication part 42 to the management station device 5 based on the transmission time inputted to the time input part 43 by the user. The transmission time is set for each vehicle 1. The main control part 46 thus corresponds to the transmission time setting part.

For example, the main control part 46 sets the transmission time, which has been inputted from the time input part 43, directly as the transmission time with respect to the vehicle 1, for which the transmission time has been inputted by way of the time input part 43. The main control part 46 is configured to use the transmission time by retrieving from the memory part 44 the transmission time received by the time input part 43.

The main control part 46 is configured to set the transmission time to a time point, at which the battery 12 of one vehicle 1 is determined to be fully charged, with respect to the other vehicle 1, for which no transmission time has been inputted on the time input part 43. The main control part 46 is configured to check whether the battery 12 is fully charged based on the charge state information acquired by the communication part 41. The main control part 46 thus corresponds to a full charge check part.

The main control part 46 is configured to execute a first check as to whether it is the transmission time for vehicle 1, which is set vehicle by vehicle as described above. In case of the first check, in which the predetermined interval of time is used, the elapse of time measured by the time measurement part 45 may be referred to. In case of the first check, in which the SOC is used, the charge state information acquired form the vehicle 1 may be referred to. Such charge state information is acquired through the communication part 41 and the communication part 14 of the vehicle 1 by requesting the transmission of such data periodically (for example at an interval of 2 minutes) from the battery charge state transmission device 4.

The main control part 46 is further configured to execute a second check based on a result of the first check, as to whether it is time to transmit the charge state information in a lump to the management station device 5. In the second check, it is determined that it is not the time of transmission of the charge state information in a lump to the management station device 5, if the result of the first check indicates that it is not the transmission time of any of vehicles 1. It is further checked whether a more than a predetermined interval remains before the next transmission time (other transmission time) of the other one of vehicles 1, if the result of the first check indicates that it is the transmission time of at least one of vehicles 1. It is determined that it is time to transmit the charge state information in a lump to the management station device 5, if the result of this check indicates the next transmission time of the other vehicle will not appear within the predetermined interval. The main control part 46 waits for the next transmission time of the other vehicle, if the result of this check indicates the next transmission time of the other vehicle will appear within the predetermined interval. The predetermined interval may be a short period of several minutes (for example, 2 to 3 minutes).

The main control part 46 transmits a charge state request signal, which requests transmission of the charge state information to the communication part 14 of vehicles 1 through the communication part 41, to acquire the latest charge state information, if the result of the second check indicates that it is the time to transmit the charge state information in a lump to the management station device 5.

The communication part 14 of each vehicle 1 transmits the data set of the charge state information and the vehicle ID in response to the charge state request signal. The data set of the charge state information and the vehicle ID is received by the communication part 41 and transmitted to the main control part 46.

The main control part 46 is configured to control the communication part 42 to transmit to the management station device 5 the data set of the latest charge state information and the vehicle ID, which is received by the communication part 41 with respect to each of vehicles 1. A plurality of the data set is transmitted in a lump. The main control part 46 is configured to transmit an object vehicle ID from the communication part 42 to the management station device 5 as information identifying a user, who should be notified of the charge state information. The object vehicle ID is the vehicle ID of the vehicle, which is an object the charge state information is transmitted to at the transmission time.

The second check may be executed in the following manner as an example. It is assumed here that the transmission times for vehicles 1A, 1B and 1C are set to be "at an interval of 10 minutes," "SOC 80%," and "SOC 100%," respectively. It is further assumed that, when it is the transmission time for the vehicle 1B, that is, "SOC 80%" is attained, it is determined that the transmission time for the vehicle 1A, that is, "at an interval of 10 minutes" appears 1 minute later. In this case, at the time of the transmission time for the vehicle 1B determined based on attainment of "SOC 80%," transmission of the latest charge state information of each vehicle 1A, 1B and 1C to the management station device 5 is not performed. Instead, the latest charge state information of each vehicle 1A, 1B and 1C is transmitted after waiting for a period of 1 minute, at which it is the transmission time for the vehicle 1A, that is, "at an interval of 10 minutes" is satisfied.

Thus, if the transmission time of the charge state information of one vehicle 1 is expected to appear within a short period of a few minutes at the time the charge state information of another external charge vehicle 1 is to be transmitted to the management station device 5, both of the charge state information of the vehicles 1 are transmitted to the management station device 5 in a lump only at the later transmission time. As a result, the number of transmission of the charge state information to the management station device 5 is reduced.

As long as delaying the transmission time of the charge state information is limited to the short period of a few minutes as described above, the charge state information transmitted with delay will include only a small error even if the charge state changes in such a delay of the short period. Thus, the delay in the transmission time will not affect so much on the accuracy of the charge state information transmitted with delay. According to the above-described example, the number of transmission of the charge state information to the management station device 5, and the amount of communication traffic as well as cost of communication with the management station device 5 can be reduced.

The second check may be executed in the following manner as another example.

It is assumed that the transmission times for vehicles 1A, 1B and 1C are set to be "at an interval of 10 minutes," "at an interval of 15 minutes" and "at an interval of 40 minutes," respectively. At the time the transmission time for vehicle 1A, that is, "at an interval of 10 minutes," is satisfied, the next transmission times for the other external charge vehicles 1B and 1C appear 5 minutes later and 30 minutes later, respectively. In this case, the transmission time for vehicle 1A is not delayed until the transmission time predetermined for the other vehicles 1B or 1C. Instead, the charge state information of vehicle 1A is transmitted to the management station device 5 immediately without delay. The charge state information of the other vehicles 1B and 1C are also transmitted to the management station device 5 in a lump at the same time. Thus, the charge state information of all vehicles 1A to 1C are transmitted in a lump at the shortest one of the intervals set as the predetermined intervals.

The main control part 46 is further configured to transmit the request signal, which requests the transmission of charge state information to the communication part 14 of vehicles 1 through the communication part 41, when a charge state request signal requesting the transmission of charge state information is received from a user through the management station device 5 and the communication part 42. In this instance, the main control part 46 transmits the request signal irrespective of the predetermined transmission time. The communication part 41 acquires the charge state information, which is transmitted from the communication part 14 of the vehicle 1 in response to the charge state information request signal. The main control part 46 combines the latest charge state information about vehicles 1A to 1C acquired by the communication part 41 and controls the communication part 42 to start transmission of the charge state information combined in a lump to the management station device 5. The main control part 46 thus corresponds to a station transmission part and a user request check part.

Figure 4:
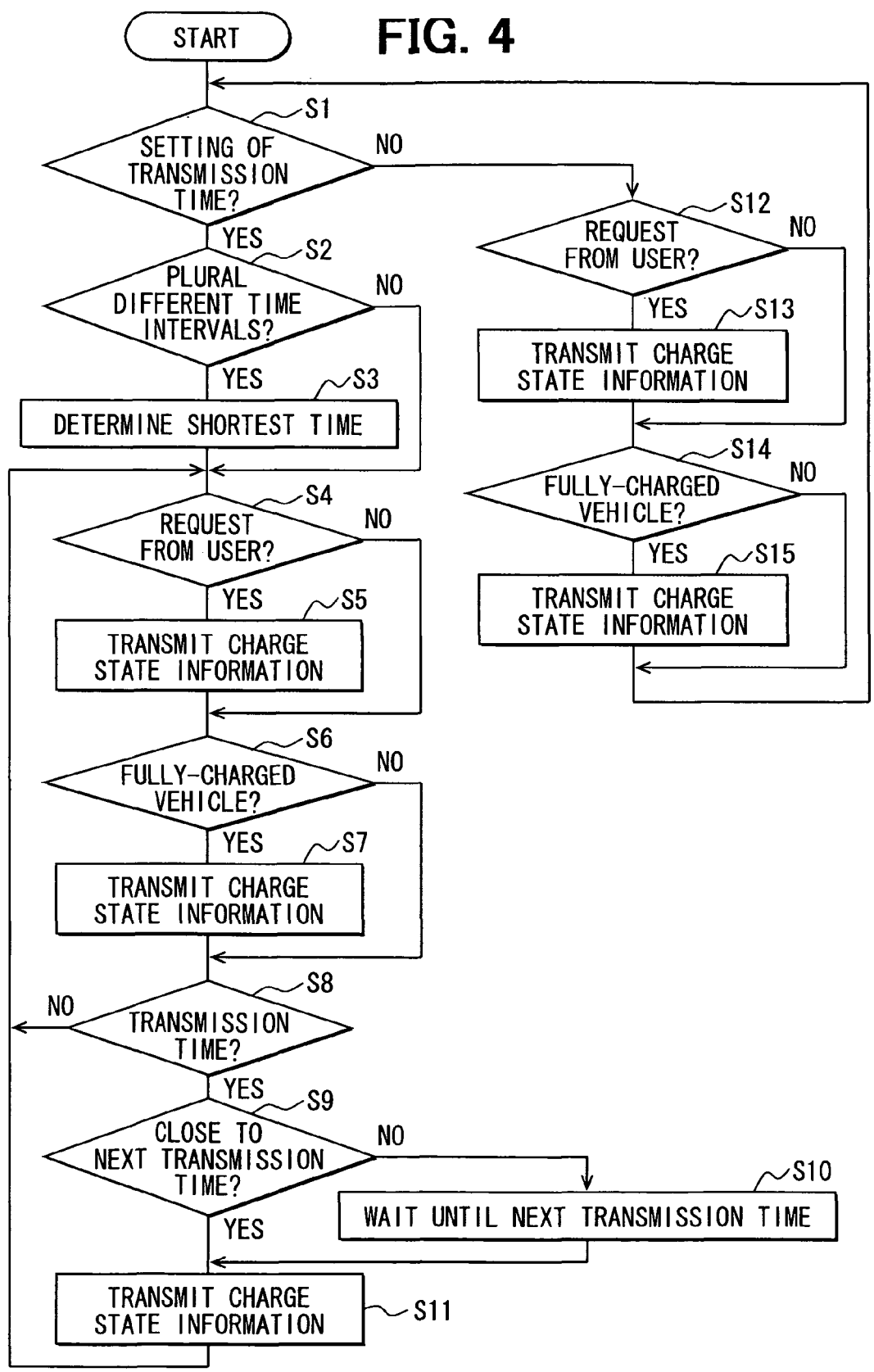
FIG. 4 is a flowchart showing processing of transmission of charge state information from the battery charge state transmission device to a management station device provided at an information management station in the embodiment.

The battery charge state transmission device 4 is configured to execute charge state information transmission processing shown in FIG. 4 for transmitting the charge state information to the management station device 5.

The processing is started when charging of the battery 12 of the vehicle 1 is started by any one of the auxiliary charging device 2 and the main charging device 3. The battery charge state transmission device 4 may acquire a signal, which indicates that the charging is started by the auxiliary charging device 2, by wired communication or radio communication from the auxiliary charging device 2, when the vehicle 1 is connected to the auxiliary charging device 2 to charge its battery 12.

At step S1, the main control part 46 checks whether a charge state information transmission time has been set. If it is determined that the transmission time has been set (YES at step S1), the main control part 46 executes step S2. If it is not determined that the transmission time has been set (NO at step S1), the main control part 46 executes step S12.

At step S2, the main control part 46 checks whether a plurality of intervals of time has been set as a plurality of transmission times among vehicles 1 and the plurality of intervals are different one another. If it is determined that the plurality of intervals has been set differently (YES at step S2), the main control part 46 executes step S3. If it is not determined that the plurality of intervals has been set differently (NO at step S2), the main control part 46 executes step S4.

The main control part 46 executes shortest time determination processing at step S3 and then executes step S4. In The shortest time determination, the main control part 46 selects the shortest one of the set plurality of intervals and determines the shortest transmission time.

The main control part 46 checks at step S4 whether the user has requested transmission of the charge state information. This check may be made based on whether a charge state request signal has been received through the management station device 5 and the communication part 42. If it is determined that the user has requested it (YES at step S4), the main control part 46 executes step S5. If it is not determined that the user has requested it (NO at step S4), the main control part 46 executes step S6.

The main control part 46 executes charge state information transmission processing at step S5 and then executes step S6. In the charge state information transmission processing, transmission of the charge state information is requested to the communication part 14 through the communication part 41. This information is requested to all vehicles 1, which are being charged with electricity by any of the auxiliary charging devices 2 and 3. The charge state information transmitted from each communication part 14 in response to this transmission request is acquired by the communication part 41. All the latest charge state information acquired by the communication part 41 are lumped and transmitted from the communication part 42 to the management station device 5 in a lump.

At step S6, the main control part 46 checks whether the battery 12 of any one of vehicles 1 has been fully charged. If it is determined that there is such a vehicle 1 (YES at step S6), the battery 12 of which has been fully charged, the main control part 46 executes step S7. If it is not determined that there is the vehicle 1 (NO at step S6), the battery 12 of which has been fully charged, the main control part 46 executes step S8. At step S7, the main control part 46 executes the same charge state information transmission processing as executed at step S5 and then executes step S8.

At step S8, the main control part 46 checks whether it is the transmission time of any of vehicles 1. If it is determined that it is the transmission time (YES at step S8), the main control part 46 executes step S9. If it is not determined that it is the transmission time (NO at step S8), the main control part 46 executes step S9.

At step S9, the main control part 46 checks whether the transmission time of the other one of the vehicles 1 is close to the transmission time of one of the vehicles 1, which is determined to be in the transmission time at step S8. This check may be made by checking whether a difference between the transmission times of two vehicles 1 is within a predetermined time range. If it is determined that the transmission time of the other vehicle 1 is close (YES at step S9), the main control part 46 executes step S11. If it is not determined, that the transmission time of the other vehicle 1 is close (NO at step S9), the main control part 46 executes step S10.

At step S10, the main control part 46 waits until the transmission time of the other vehicle 1, which will appear next within the predetermined time range. The main control part 46 executes step S11 after waiting. At step S11, the main control part 46 executes the same charge state information transmission processing as executed in steps S5 and S7. The main control part 46 then repeats the foregoing steps S4 to S11 in the similar manner as described above.

The main control part 46 checks at step S12, in the similar manner as at step S4, whether the user has requested transmission of the charge state information. This check may be made based on whether the charge state request signal has been received through the management station device 5 and the communication part 42. If it is determined that the user has requested it (YES at step S12), the main control part 46 executes step S13. If it is not determined that the user has requested it (NO at step S12), the main control part 46 executes step S14. The main control part 46 executes the charge state information transmission processing at step S13 similarly as executed at steps S5 and S7 and then executes step S14.

At step S14, the main control part 46 checks whether there is any one of vehicles 1, the battery 12 of which has been fully charged. If it is determined that there is any vehicle 1 (YES at step S14), the battery 12 of which has been fully charged, the main control part 46 executes step S15. If it is not determined that there is any vehicle 1 (NO at step S14), the battery 12 of which has been fully charged, the main control part 46 repeats the foregoing steps from step S1. The main control part 46 executes the charge state information transmission processing similarly as executed at steps S5, S7 and S13 and then returns to step S1 to repeat the foregoing steps from step S1.

The foregoing operation described with reference to FIG. 4 is terminated when charging of the batteries 12 of the vehicles 1 connected to the charging devices 2 and 3 are all completed, that is, all the vehicles 1 are electrically disconnected from the charging devices 2 and 3.

Referring to FIG. 1 again, the management station device 5 is a computer provided at the information management station, which manages the charge state information indicating the charge state of each battery 12 of vehicles 1.

Figure 5:
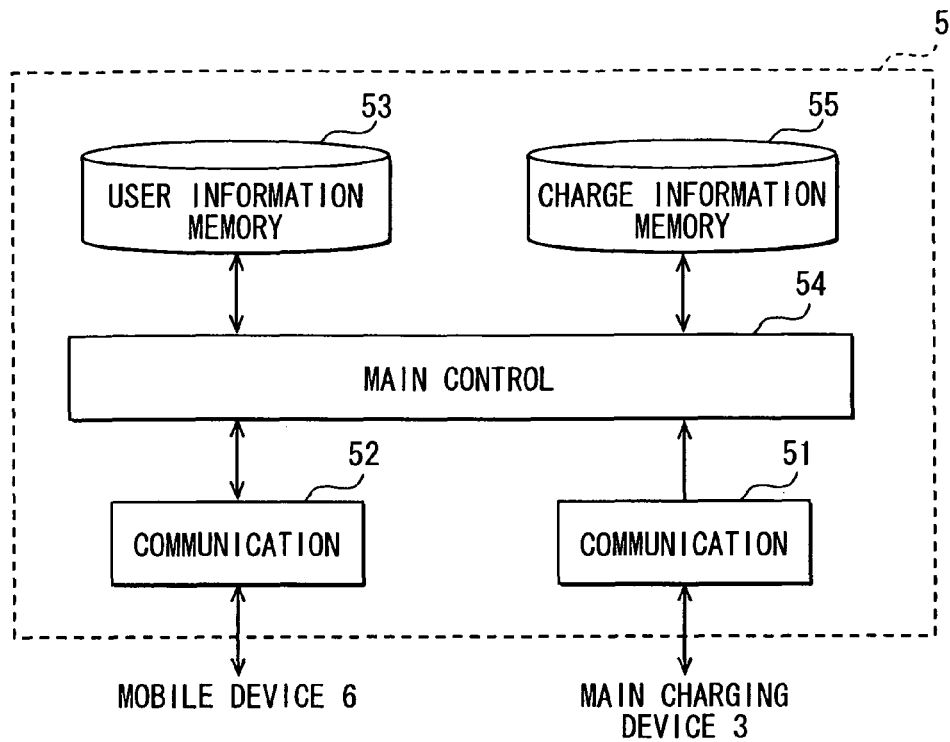
FIG. 5 is a block diagram schematically showing one example of the management station device in the embodiment.
Figure 6:
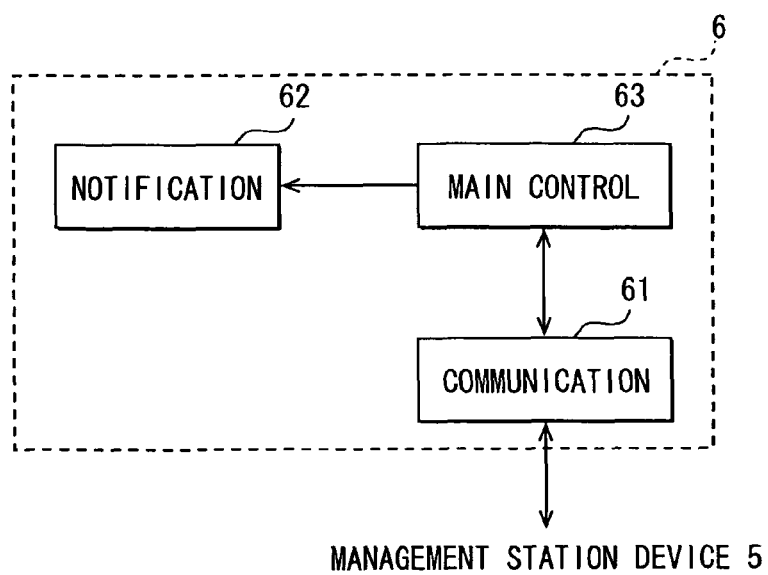
FIG. 6 is a block diagram schematically showing one example of a mobile device in the embodiment.

The management station device 5 includes, as shown in FIG. 5, a charging device communication part 51, a mobile device communication part 52, a user vehicle specifying information memory part 53, a main control part 54 and a charge state information memory part 55.

The communication part 51 is provided for communication with the main charging device 3. Specifically, the communication part 51 is configured to receive the data set of the charge state information and the vehicle ID as well as the transmission object vehicle ID transmitted from the main charging device 3 and transmit these to the main control part 54. The communication part 51 is further configured to transmit the charge state request signal, which requests transmission of the charge state information, and the like to the main charging device 3 under control of the main control part 54. The communication between the communication part 51 and the main charging device 3 may be performed by way of a communication network, for example, a cellular phone network or Internet.

The communication part 52 is provided for communication with the mobile device 6. Specifically, the communication part 52 is configured to receive the charge state request signal transmitted from the mobile device 6 and transmit it to the main control part 54. The communication part 52 is further configured to transmit the charge state information to the mobile device 6 under control of the main control part 54. The communication between the communication part 52 and the mobile device 6 may be performed by way of a communication network, for example, a cellular phone network or Internet.

The user vehicle specifying memory part 53 includes a memory such as an electrically rewritable EEPROM, which stores correspondence between the vehicle ID of each vehicle 1 and the mobile device 6 (specifically, phone number and mail address) of the user A to C of vehicles 1.

The main control part 54 is a microcomputer, which includes a CPU, a ROM, a RAM, a backup RAM and the like, and configured to perform various processing by executing various control programs stored in the ROM. For example, the main control part 54 is configured to store the data set of the charge state information and the vehicle ID transmitted from the communication part 51 in the charge state information memory part 55. The charge information memory part 55 may be an electrically rewritable EEPROM or a RAM and stores the data set of the charge state information and the vehicle ID of vehicle 1 transmitted from the main charging device 3.

The main control part 54 is configured to acquire the charge state information corresponding to the transmission object vehicle ID from the memory part 55 by referring to the charge information memory part 55 based on the transmission object vehicle ID transmitted from the communication part 51. The main control part 54 is further configured to acquire the phone number, the mail address and the like, which correspond to the object vehicle ID, from the user information memory part 53 by referring to the user information memory part 53 based on the transmission object vehicle ID. The main control part 54 is configured to control the communication part 52 to transmit the charge state information acquired from the charge information memory part 55 to a device, which is identified by the acquired phone number or main address.

The main control part 54 is further configured to transmit (forward) the charge state request signal to the battery charge state transmission device 4, when the charge state request signal transmitted from the mobile device 6 is acquired through the communication part 52. The main control part 54 is further configured to acquire the vehicle ID of vehicle 1, which is used by the user of the mobile device 6, by referring to the user information memory part 53 based on the phone number or the mail address of the mobile device 6.

When the charge state request signal is transmitted to the battery charge state transmission device 4 and received by the communication part 42 of the battery charge state transmission device 4 of the main charging device 3, the battery charge state transmission device 4 transmits the charge state information of all the vehicles 1 in a lump to the management station device 5. The main control part 54 is configured to select the charge state information of a specific one of the vehicles 1, which is specified by the vehicle ID acquired based on the phone number or the mail address of the mobile device 6, when the charge state information is transmitted from the battery charge state transmission device 4. The main control part 54 is configured to control the communication part 52 to transmit the selected charge state information to the mobile device 6.

Referring to FIG. 1 again, the mobile devices 6 are carried by the users A to C of the vehicles 1, respectively, for communication with the management station device 5.

The mobile device 6 includes a station communication part 61, a notification part 62 and a main control part 63. The mobile device 6 has generally the same configuration as the commercially available one.

The communication part 61 is provided for communication with the management station device 5. Specifically, the communication part 61 is configured to receive the charge state information transmitted from the management station device 5 and transmit it to the main control part 63. The communication part 61 is further configured to transmit the charge state request signal to the management station device 5 under control of the main control part 63.

The notification part 62 includes a display part or a sound output part, which provides information as notification. The display part may be a liquid crystal display, an organic EL display, a plasma display or the like, which provides information in texts or images. The sound output part may be a speaker, which produces voice sounds under control of the main control part 63.

The main control part 63 is a microcomputer, which includes a CPU, a ROM, a RAM, a backup RAM and the like, and configured to perform various processing by executing various control programs stored in the ROM. For example, the main control part 63 is configured to notify the charge state information to the user of the mobile device 6 by providing on the notification part 62 the charge state information transmitted from the communication part 61. Specifically, the main control part 63 is configured to control the display part to provide a display image varying with the amount of charge as the charge state information or control the sound output part to produce a voice sound varying with the amount of charge as the charge state information.

The operation of the external charging system 100 is described below with reference to FIGS. 7 and 8, which show flow of data.

In the battery charge state transmission device 4 of the main charging device 3, the transmission time inputted by each of the users A to C by switch operation is set as the transmission time of the charge state information of vehicle 1A to 1C and stored in the memory part 44 (time t10). In this example, the transmission times are set to "at an interval of 10 minutes," "at time of attaining SOC 80%," and "none" with respect to the vehicles 1A, 1B and 1C, respectively. In case that no transmission time is set for a vehicle, the transmission time for vehicle 1C is automatically set to time, at which the battery 12 of vehicle 1C is fully charged.

When the charge state request signal is transmitted from the mobile device 6C of the user C to the management station device 5 (time t20), the charge state request signal is forwarded to the battery charge state transmission device 4 from the management station device 5 (time t30).

Upon receiving the charge state request signal, the battery charge state transmission device 4 transmits the request of transmission of charge state information to all vehicles 1A to 1C (time t40), which are being charged by the charging devices 2 and 3. The vehicles 1A to 1C transmit respective charge state information to the battery charge state transmission device 4 in response to the transmission request (time t50). It is assumed that the charge levels of the batteries 12 of vehicles 1A to 1C at this moment are "SOC 35%," "SOC 90%" and "SOC 65%," respectively.

After receiving the charge state information from each of vehicles 1A to 1C, the battery charge state transmission device 4 transmits all the received charge state information in a lump to the management station device 5 (time t60) immediately as a response to the charge state request from the management station device 5 irrespective of the inputted transmission times. After receiving the charge state information of all vehicles 1A to 1C in a lump, the management station device 5 transmits the charge state information of vehicle 1C, the user C of which has requested the charge state information to the mobile device 6C of the user C (time t70), who has requested it. The mobile device 6C, receiving the charge state information (65%) provides a display or the like that indicates "SOC 65%" as a preset charge level (time t80).

It is assumed that, when a near-A-flag, which indicates that the transmission time for vehicle 1A is nearing (coming soon), is turned on (time t100) and then an A-flag, which indicates that the transmission time for vehicle 1A has come, is turned on (time MO), other near-flag such as a near-B-flag, which indicates that the transmission time for vehicle 1B is nearing, is not turned on. In this case, the battery charge state transmission device 4 transmits the request of transmission of charge state information to all vehicles 1A to 1C (time t120).

All the vehicles 1A to 1C transmit respective charge state information to the battery charge state transmission device 4 in response to the transmission request (time t130). It is assumed the charge levels of the batteries 12 of vehicles 1A to 1C at this moment are "SOC 45%," "SOC 97%" and "SOC 70%," respectively.

After receiving the charge state information from each of vehicles 1A to 1C, the battery charge state transmission device 4 transmits all the received charge state information in a lump to the management station device 5 (time t140) as a response to the inputted and set transmission time for the vehicle 1A. After receiving the charge state information of all vehicles 1A to 1C in a lump, the management station device 5 transmits the charge state information (45%) of vehicle 1A to the mobile device 6A of the user A (time t150). This is because the A-flag has already been turned on at time t110. The mobile device 6A, receiving the charge state information (45%) provides a display or the like that indicates "SOC 45%" as a preset charge level (time t160).

It is noted here that, in case the transmission time is set as an interval of time, a near-flag indicating that the transmission time is nearing is turned on when a remaining interval of time from the present time to the set transmission time falls in a predetermined interval range. The flag of transmission is turned on, when the transmission time has arrived.

It is assumed that, immediately (for example, within a short period of 1 to 3 minutes) after the management station device 5 receives the charge state information of each of vehicles 1A to 1C from the battery charge state transmission device 4 at time t140, the management station device 5 receives the request of transmission of the charge state from the mobile device 6C (time t170) as requested at time t20. In this case, the management station device 5 does not transmit the charge state information request signal to the battery charge state transmission device 4 as opposed to that made at time t30. The management station device 5 instead transmits the latest charge state information of vehicle 1C to the mobile device 6C (time t180). This latest charge state information corresponds to the charge state information, which the management station device 5 has already acquired at time t140.

Figure 7:
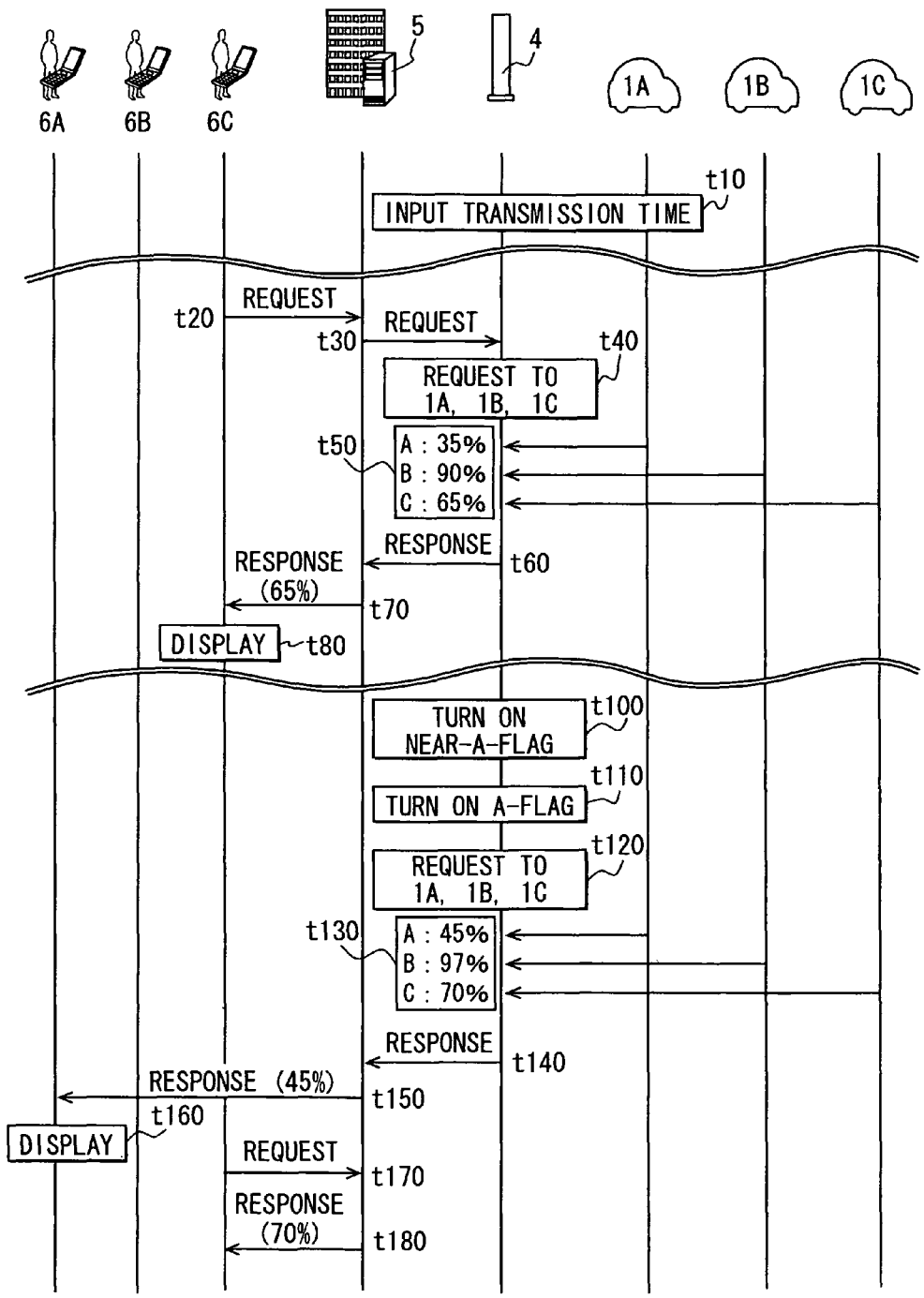
FIG. 7 is a diagram schematically showing a part of data flow in the external charging system in the embodiment.
Figure 8:
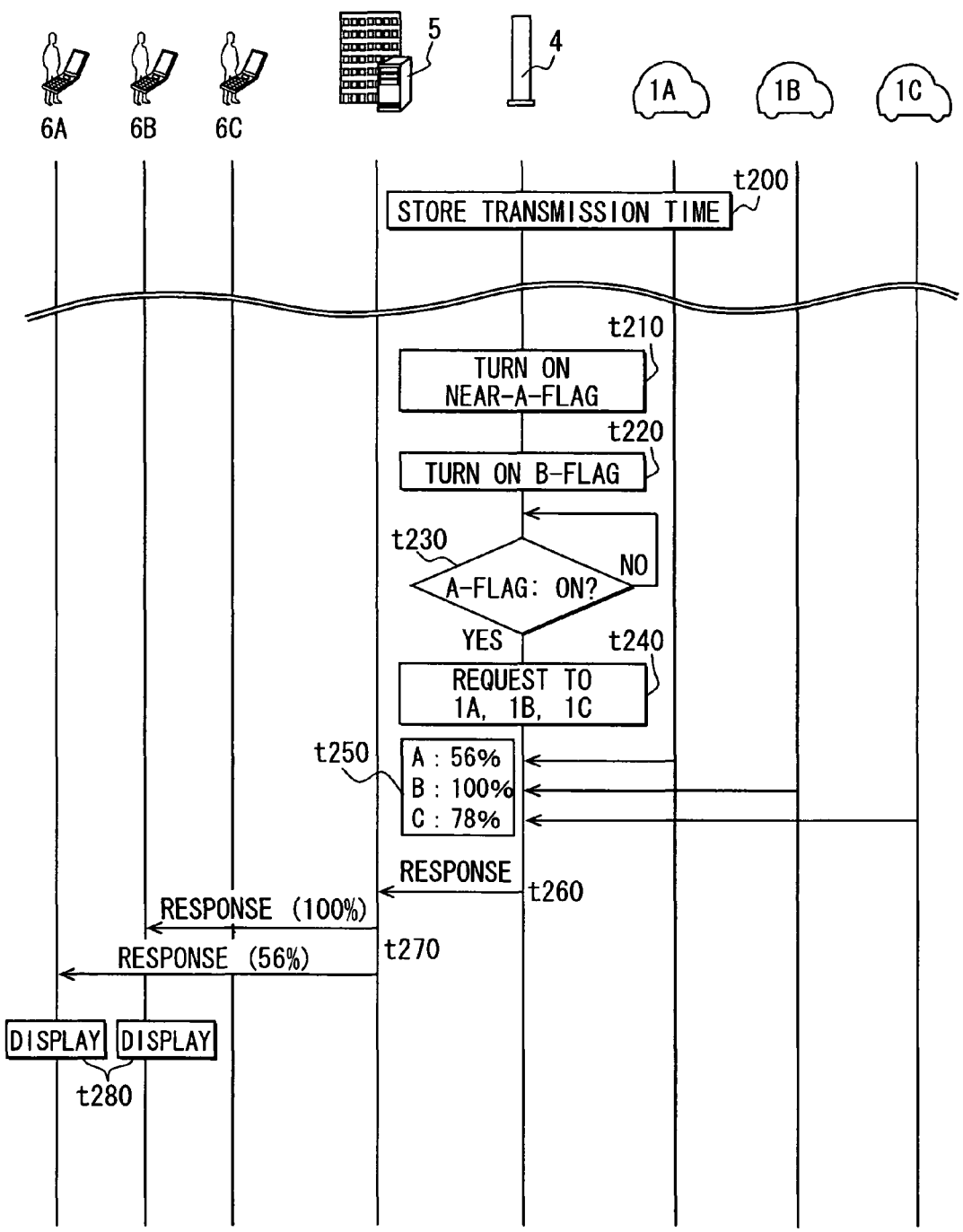
FIG. 8 is a diagram schematically showing another part of data flow in the external charging system in the embodiment.

In the example shown in FIG. 8, the transmission time of each vehicle 1A to 1C is stored in the memory part 44 at time t200 in the same manner as stored at time t10 in FIG. 7.

It is assumed that the near-A-flag of the transmission time for vehicle 1A is turned on (time t210) and, before the transmission flag for vehicle 1A (A-flag) is turned on, the B-flag indicating the transmission time for vehicle 1B is turned on (time t220). In this instance, it is expected that the transmission flag for the vehicle A (A-flag) will be turned on soon. The battery charge state transmission device 4 waits until the A-flag for vehicle 1A is turned on (time t230). When the transmission flag for vehicle 1A is turned on, the battery charge state transmission device 4 requests all vehicles 1A to 1C to transmit the respective charge state information (time t240). The vehicles 1A to 1C transmit the respective charge state information to the battery charge state transmission device 4 (time t250) in response to the transmission request. The battery charge state transmission device 4 then transmits all the received charge state information of vehicles 1A to 1C in a lump to the management station device 5 (time t260).

It is assumed here that the transmission time for transmitting the charge state information of vehicle 1A to the management station device 5 will also come within a short period of about a few minutes, when the charge state information of vehicle 1B is to be transmitted to the management station device 5. In this instance, the charge state information of vehicle 1B is transmitted in a lump to the management station device 5 later together with the charge state information of vehicle 1A, which is expected to be transmitted.

It is assumed that the charge levels of the batteries 12 of vehicles 1A to 1C are "SOC 56%," "SOC 100%" and "SOC 78%," respectively, at time of transmission of the charge state information of vehicle 1A to the management station device 5.

the management station device 5, receiving the charge state information of vehicles 1A to 1C in a lump, transmits the charge state information of vehicles 1A and 1B to the mobile devices 6A and 6B of the users A and B, respectively. This is because it is the transmission time for vehicles 1A and 1B but not vehicle 1C. The mobile devices 6A and 6B, receiving the charge state information of vehicles 1A and 1B, provide respective notifications indicating the present charge levels, "SOC 56%" and "SOC 100%," respectively (time t280).

According to the embodiment, the charge state information of each vehicle 1A to 1C acquired by the communication part 41 of the main charging device 3 is transmitted in a lump, the number of transmitting the charge state information to the management station device 5 is reduced. For example, in some cases, two or more charge state information of vehicles 1 are required at the same time by the management station device 5 (that is, by the mobile devices 6). In such cases, the number of transmission of the charge state information to the management station device 5 is reduced in comparison to the other case, in which each charge state information of vehicles 1A to 1C is transmitted individually, that is, at different transmission time points. By thus reducing the number of the transmission of the charge state information to the management station device 5, the amount of communication traffic with the management station device 5 is reduced further.

Even if the communication network between the main charging device 3 and the management station device 5 is a toll-charged network, the communication cost is reduced because the number of transmission of the charge state information to the management station device 5 is reduced. The embodiment is of advantage in a case that the external charging system 100 includes a toll-charged network between the main charging device 3 and the management station device 5.

Users of the external charging system 100 generally want to acquire the charge state information of vehicle 1 in a relatively short interval, for example, an interval of minutes or hours. The charge state information therefore need be uploaded frequently to the management station device 5. By transmitting the charge state information of the vehicles 1 to the management station device 5 in a lump, the number of transmission of the charge state information to the management station device 5 is reduced in comparison to the number of the vehicles 1. It is therefore possible to increase the number of uploading of the charge state information in a lump by reducing the number of individual transmission of the charge state information of each vehicle 1.

According to the embodiment, the charge state information of each vehicle 1 is transmitted in a lump by way of only one-to-one communication between the management station device 5 and the main charging device 3. It is therefore possible to reduce the load of processing of the management station device 5 in comparison to the case that the charge state information of each vehicle 1 is transmitted individually way of one-to-many communication between the management station device 5 and the charging devices 2 and 3.

Further, according to the embodiment, the management station device receives the charge state information transmitted from the main charging device 3, and transmits the charge state information, which is the subject information to be transmitted at present among the plurality of charge state information received in a lump, to the mobile device 6 carried by the user of the corresponding vehicle 1. The mobile device 6 notifies the user of the charge state of the corresponding battery 12 of the vehicle 1 of the user. As a result, the user can readily acquire the charge state information of his/her vehicle 1 at a remote location, which is away from his/her vehicle 1, the main charging device 3 and the management station device 5. For example, in case that the vehicle 1 is charged with electricity at a parking lot of a shopping center, the user can acquire the charge state information of his/her vehicle 1 by way of the mobile device 6 while shopping.

In the embodiment, the charge state information need not be transmitted to the main charging device 3 in response to the request from the main charging device 3. For example, the charge state information of the vehicles 1 may be transmitted periodically (for example, at every 2 minutes) from each vehicle 1 to the main charging device 3. In this instance, each of the charge state information transmitted periodically from the vehicle 1 may be stored in a temporary memory such as a RAM of the main control part 46 and each of the latest charge state information stored in the temporary memory may be transmitted in a lump to the management station device 5 at the set transmission time.

In the embodiment, the main charging device 3 need not acquire both the charge state information and the vehicle ID of each vehicle directly from the vehicles 1. For example, in case the battery 12 of vehicle 1, which is being charged by the auxiliary charging device 2, the charge state information and the vehicle ID of vehicle 1 may be transmitted to the main charging device 3 through the auxiliary charging device 2, which is charging the vehicle 1. When the main charging device 3 receives the request of transmission of the charge state information from the management station device 5, the main charging device 3 may request the transmission of charge state information to the auxiliary charging device 2 so that the auxiliary charging device 2 may request the vehicle 1, which is being charged, to transmit the charge state information. The communication between the auxiliary charging device 2 and the main charging device 3 may be performed by way of radio communication or wired communication. It is also possible to perform power line cable communication between the communication part 14 of the vehicle 1 and the charging devices 2 and 3, in case that the battery 12 of the vehicle 1 is charged by the auxiliary charging device 2 or the main charging device 3 through the power line cable.

In the embodiment, the transmission time need not be set by operating the input part 43 of the main charging device 3. For example, the vehicle 1 may be provided with an operation input part (not shown), which receives input of transmission time. The inputted transmission time received by the vehicle 1 may be transmitted to the main control part 46 of the main charging device 3 through the communication part 14 and the communication part 41 so that the main control part 46 may set the received transmission time therein. It is preferred to transmit the vehicle ID with the inputted transmission time from vehicle 1A to 1D so that the main charging device 3 may identify the vehicle, to which the transmission time is set. Further, the mobile device 6 may receive input of transmission time by its input operation part (not shown). The inputted transmission time may be transmitted to the main control part 46 of the main charging device 3 through the management station device 5 so that the main control part 46 may set the received transmission time therein. The main control part 54 of the management station device 5 may acquire the vehicle ID by referring to the memory part 53 based on the phone or the main address of the mobile device 6 and vehicle ID. The acquired vehicle ID is transmitted from the management station device 5 to the main charging device 3 together with the transmission time so that the main charging device 3 may identify the vehicle, to which the transmission time is set.

In the embodiment, the charge control part 13 need not calculate the actual SOC to be used as the charge state information of the vehicle 1 by the external charging system 100. For example, the charge control part 13 may monitor the charge/discharge amount of the battery 12, calculate a remaining charge time or a travelable distance based on the calculated charge/discharge amount and use the calculated remaining charge time or the travelable distance as the charge state information. The remaining charge time indicates time required for the battery 12 to be charged fully. The travelable distance indicates a distance, which the vehicle 1 can possibly travel with the remaining charge amount of the battery 12. The remaining charge time and the travelable distance thus calculated and used as the charge state information may also be notified to the user by way of the mobile device 6.

The mobile device 6 need not be a cell phone. Any electronic device may be used as long as it is carried by the user of the vehicle 1 capable of communication with the management station device 5 and notification of information.

The external charging system 100 need not include three external charge vehicles 1A to 1C. The external charging system 100 may include a plurality of vehicles 1 other than three vehicles 1A to 1C. The number of mobile devices 6 may be other than three.

The present invention is not limited to the disclosed embodiment but may be implemented in other ways.

What is claimed is:

1. A battery charge state transmission device used in an external charging system for a plurality of external charge vehicles, each of which includes an electric motor as a travel drive power source and a battery for supplying electric power to the electric motor, the external charging system including a plurality of external charging devices provided externally to the vehicles for charging the battery from an external side of each vehicle and a management station for managing the plurality of external charging devices, the battery charge state transmission device provided to transmit charge state information indicating a state of charge of the battery to a management station device, the battery charge state transmission device comprising:
a charge state information acquisition part configured to acquire the charge state information from the plurality of external charging devices charging the vehicles or from the plurality of vehicles being charged by the plurality of charging devices; and
a station transmission part configured to transmit a plurality of charge state information to the management station device in a lump, the plurality of charge state information being acquired by the charge state information acquisition part.

2. The battery charge state transmission device according to claim 1, further comprising:
a transmission time setting part configured to set a transmission time of transmitting the charge state information to the management station device with respect to each of the vehicles; and
a station transmission control part configured to determine a transmission time based on the plurality of transmission times of the plurality of external charge vehicles set by the transmission time setting part and configured to control the management station device to transmit the plurality of charge state information acquired by the charge state information acquisition part to the management station device in a lump.

3. The battery charge state transmission device according to claim 2, further comprising:
a transmission time input part configured to receive input of the transmission time of each vehicle by a user,
wherein the transmission time setting part is configured to set the transmission time received by the transmission time input part as the transmission time for vehicle.

4. The battery charge state transmission device according to claim 3, wherein:
the transmission time input part is configured to enable the user to input the transmission time selectively as one or a plurality of a predetermined interval of time, a predetermined interval of charge level of the battery and attainment of a predetermined charge level of the battery.

5. The battery charge state transmission device according to claim 4, wherein:
the station transmission control part is configured to control, when a plurality of different fixed intervals of time is set as the transmission times set for the plurality of vehicles by the transmission time setting part, the station transmission part to transmit the plurality of charge state information to the management station device in a lump at a shortest interval of time among the plurality of fixed intervals of time.

6. The battery charge state transmission device according to claim 2, wherein:

the station transmission control part is configured to control the station transmission part to transmit the plurality of charge state information to the management station device in a lump at only a later one of the transmission times set for one of the vehicles after waiting from an earlier one of the transmission times set for another one of the vehicles, when the later one of the transmission times comes within a predetermined time period after the earlier one of the transmission times at the earlier one of the transmission times.

7. The battery charge state transmission device according to claim 2, further comprising:

a full charge check part configured to check whether the battery has been fully charged, wherein the station transmission control part is configured to control the station transmission part to transmit the plurality of charge state information to the management station device in a lump irrespective of the transmission times of the plurality of vehicles, when the battery of any one of the plurality of vehicles has been fully charged.

8. The battery charge state transmission device according to claim 2, further comprising:

a user request check part configured to check whether an information transmission request, which requests transmission of the charge state information of the vehicle of the user, is received from the user of the vehicle, wherein the station transmission control part is configured to control the station transmission part to transmit the plurality of charge state information to the management station device in a lump irrespective of the transmission times of the plurality of vehicles, when the information transmission request is received.

9. An external charging system for a plurality of external charge vehicles, each of which includes an electric motor as a travel drive power source and a battery for supplying electric power to the electric motor, the external charging system comprising:

a plurality of external charging devices provided externally to the vehicles for charging the battery from an external side of each vehicle;

a management station device for managing the plurality of external charging devices; and a battery charge state transmission device provided to transmit charge state information indicating a state of charge of the battery to the management station device, wherein the battery charge state transmission device includes a charge state information acquisition part configured to acquire the charge state information from the plurality of external charging devices charging the vehicles or from the plurality of vehicles being charged by the plurality of charging devices, and a station, transmission part configured to transmit a plurality of charge state information to the management station device in a lump, the plurality of charge state information being acquired by the charge state information acquisition part.

10. The external charging system according to claim 9, further comprising:

a plurality of portable devices carried by users of the plurality of vehicles for communication with the management station device, wherein the battery charge state transmission device includes a transmission time setting part configured to set a transmission time of transmitting the charge state information to the management station device with respect to each of vehicles, and a station transmission control part configured to determine a transmission time based on the plurality of transmission times of the plurality of external charge vehicles and configured to control the management station device to transmit the plurality of charge state information acquired by the charge state information acquisition part to the management station device in a lump, wherein the management station device is configured to receive the charge state information transmitted from the station transmission part of the battery charge state transmission device, and transmit the charge state information of one of the vehicles, the transmission time of which is at present, to the mobile device carried by the user of the one of the vehicles, and wherein the mobile device is configured to receive the charge state information transmitted from the management station device and notify the user of the portable device of the received charge state information.

11. The external charging system according to claim 10, wherein:

the management station device is configured to check whether a predetermined time has elapsed from a previous reception of the charge state information, when the information transmission request of the one of the vehicles is received from the user of the one of the vehicles;

the management station device is configured to transmit the information transmission request to the battery charge state transmission device when the predetermined time has elapsed; and the management station device is configured to transmit the charge state information of vehicle, which is requested by the user, to the mobile device of the user, when the predetermined time has not elapsed yet.

12. The external charging system according to claim 9, wherein:

the battery charge state transmission device and the management station device are connected by way of a communication network which is toll-charged for communication therethrough.

* * * * *